United States Patent [19]
Gillespie

[11] Patent Number: 4,772,539
[45] Date of Patent: Sep. 20, 1988

[54] HIGH RESOLUTION E-BEAM LITHOGRAPHIC TECHNIQUE

[75] Inventor: Sherry J. Gillespie, Essex Junction, Vt.

[73] Assignee: International Business Machines Corporation, Armonk, N.Y.

[21] Appl. No.: 29,110

[22] Filed: Mar. 23, 1987

[51] Int. Cl.$^4$ .............................................. G03C 5/00
[52] U.S. Cl. ................... 430/296; 430/314; 430/317; 430/323; 430/329; 430/942; 156/628; 437/931
[58] Field of Search ............. 430/313, 314, 312, 296, 430/322, 323, 324, 942, 317, 329; 427/38; 437/36, 931; 156/628; 250/492.2 A, 492.2 B, 492.3

[56] References Cited

U.S. PATENT DOCUMENTS

| | | | |
|---|---|---|---|
| 3,799,777 | 3/1974 | O'Keefe et al. | 430/296 |
| 3,873,371 | 3/1975 | Wolf | 148/1.5 |
| 3,920,483 | 11/1975 | Johnson et al. | 148/1.5 |
| 4,093,503 | 6/1978 | Harris et al. | 156/628 |
| 4,231,811 | 11/1980 | Somekh et al. | 148/1.5 |
| 4,298,803 | 11/1981 | Matsuura et al. | 250/492.2 |
| 4,348,804 | 9/1982 | Ogawa et al. | 437/17 |
| 4,377,437 | 3/1983 | Taylor et al. | 156/628 |
| 4,394,211 | 7/1983 | Uchiyama et al. | 156/628 |
| 4,403,151 | 9/1983 | Mochiji et al. | 250/492.2 |
| 4,438,556 | 3/1984 | Komatsu et al. | 437/31 |
| 4,451,738 | 5/1984 | Smith | 250/492.2 |
| 4,502,916 | 3/1985 | Umezaki et al. | 156/643 |
| 4,514,251 | 4/1985 | van Ommen et al. | 156/628 |
| 4,551,417 | 11/1985 | Suzuki et al. | 430/316 |
| 4,569,124 | 2/1986 | Rensch et al. | 437/41 |

FOREIGN PATENT DOCUMENTS 57-208142 12/1982 Japan ................... 156/628

OTHER PUBLICATIONS

Broyde, "Exposure of Photoresists", J. Electrochem. Soc.: Solid State Science, vol. 117(12), Dec. 1970, pp. 1555-1556.

"An Approach to Quarter-Micron E-Beam Lithography Using Optimized Double Layer Resist Process," Y. Lida et al, 1983 IEEE, IEDM 83, pp. 562-565.

"Electron Beam Fabrication of High Resolution Masks," J. L. Kenty et al, J. Vac. Sci. Technol. B 1 (4), Oct.-Dec. 1983, pp. 1211-1214.

"High Resolution Photomasks with Ion-Bombarded Polymethyl Methacrylate Masking Medium," B. A. MacIver, J. Electrochem. Soc.: Solid-State Science and Tech., Apr. 1982, pp. 827-830.

"Electron-Beam Direct Writing Technology for LSI Wiring Process," F. Murai et al, 1983 IEEE, IEDM 83, pp. 558-561.

"A New Electron Beam Patterning Technolgy for 0.2 $\mu$m VLSI," T. Ishii et al, May 1985 VLSI Symp., pp. 70-71.

Primary Examiner—Jose' G. Dees
Attorney, Agent, or Firm—Mark F. Chadurjian

[57] ABSTRACT

A method of reproducing sub-micron images in a first imaging layer. A second imaging layer is deposited on an etch-stop film formed on the first layer, and the second imaging layer is exposed to an E-beam at low dose. The resulting standing wave exposure pattern is converted into a corresponding topology pattern having peaks and valleys by exposure to a wet developer. Ions are implanted through the second imaging layer into portions of the first imaging layer below the valley portions of the standing wave topology pattern. The second imaging layer is removed without appreciably attacking the etch-stop layer, and then the etch stop layer is removed without appreciably attacking the first imaging layer. The first imaging layer is anisotropically etched in an $O_2$ RIE, the implanted regions serving as an etch mask. The process results in the formation of small images at high throughput.

13 Claims, 1 Drawing Sheet

HIGH RESOLUTION E-BEAM LITHOGRAPHIC TECHNIQUE

BACKGROUND OF THE INVENTION

Optical exposure systems are the current technology of choice for patterning photosensitive polymers in manufacturing applications. However, in the submicron world that looms on the horizon, exotic photoresist compositions and complex processing techniques will become increasingly necessary in order to prolong the viability of optical exposure systems. Accordingly, alternate photoresist exposure systems are being explored in the hope that they will fulfill the stringent manufacturing requirements of tomorrow's technology.

One particularly promising technology is electron beam (E-beam) exposure. In these systems, beams of electrons are irradiated on a surface to be patterned. In a particular application referred to as "direct-write E-beam exposure," these electron beams are controlled by an imposed electric field to expose selected areas of a photoresist layer, rather than exposing selected areas of the photoresist through a metallic mask as in conventional optical exposure systems. Since these metallic masks are costly to design and produce, the combined advantages of printing images at tighter geometries and eliminating metallic masks make direct-write E-beam systems very attractive.

An article by Kenty et al, entitled "Electron Beam Fabrication of High Resolution Masks," *J. Vac. Sci. Tech.*, October-December 1983, pp. 1211-1214 discusses a particular patterning method for E-beam exposed resists. A quartz plate coated with polymethyl methacrylate (PMMA) was exposed to a direct-write electron beam at 20 kev in order to form 0.5 m features upon wet development. The resist pattern was then ion implanted with silicon, and the resulting mask was found to work well as a photomask for optically exposing other photoresist materials. See also an article by MacIver, entitled "High Resolution Photomasks with Ion-Bombarded Polymethyl Methacrylate Masking Medium," *J. Electrochem Soc.: Solid-State Sci. & Tech.*, April 1982 pp. 827-830.

In an article by Iida et al, entitled "An Approach to Quarter-Micron E-Beam Lithography Using Optimized Double Layer Resist Process," *IEDM Digest of Technical Papers* 1983, Paper 25.6, pp, 562-565, an E-beam is used in a direct write mode to pattern an upper thin layer of photoresist. The patterned photoresist is in turn used to pattern an underlaying thicker polyimide layer in an $O_2$ plasma. As shown in FIG. 2 of the paper, by patterning only the upper 0.4 $\mu$m photoresist layer be direct-write E-beam techniques, a 20 kev acceleration voltage produces better results than patterning a single, 1.8 $\mu$m photoresist layer at a 120 kev acceleration voltage.

In an article by Ishii et al, entitled "A New Electron Beam Patterning Technology for 0.2 $\mu$m VLSI," 1985 *VLSI Symposium*, May 14-16 1985, Kobe, Japan, paper VIII-1, pp. 70-71, a direct-write E-beam system (acceleration voltage of 30 kev) is used to partially expose and pattern a photoresist layer. That is, only the upper portion of the photoresist layer is patterned. Then a second layer is deposited on the photoresist layer. The second layer is etched back so that portions of the second layer remain in the pattern that was formed in the photoresist. Finally, the photoresist is etched under conditions that do not etch the remaining portions of the second layer, so that the exposed portions of the photoresist are removed. A silicon resin was used as the second layer and PMMA was used as the photoresist. Note that in order to adequately define the final pattern, the etchback of the second layer had to be continued until at least half of the patterned portion of the photoresist layer was removed.

Both of the above Iida and Ishii articles are directed to the same general idea. In order to completely pattern single photoresist layers of a thickness of 1 $\mu$m or greater, the acceleration voltage must be kept at a high level and the photoresist must be exposed to the E-beam for a longer period of time (in other words, the E-beam "dose" necessary to pattern a conventional photoresist layer is high). As the dose increases, the throughput of the exposure tool decreases. Thus, others such as Iida and Ishii have attempted to decrease the necessary dose (to decrease dwell time and hence increase throughput) by totally patterning a thin layer (Iida) or by partially patterning a thick layer (Ishii).

Accordingly, there is a need to formulate other processes that increase the throughput of direct-write E-beam exposure systems.

SUMMARY OF THE INVENTION

It is thus an object of the present invention to increase the throughput of direct-write E-beam systems.

It is another object of the invention to formulate a simple E-beam exposure process.

It is yet another object of the invention to provide an E-beam exposure process that reliably prints submicron images at high throughput.

The above and other objects of the invention are realized by a method of forming small images in a first imaging layer arranged on a substrate, comprising the steps of forming a second imaging layer on the first imaging layer; exposing the second imaging layer under conditions such that an exposure pattern is formed only in an upper portion of the second imaging layer; developing the second imaging layer to convert the exposure pattern into a topology pattern in the upper portion of the second imaging layer; implanting ions through the second imaging layer into portions of the first imaging layer, as a function of the topology pattern in the second imaging layer; removing the second imaging layer; and etching the first imaging layer under conditions that do not appreciably attack implanted portions thereof, so as to form a pattern in the first imaging layer. Because a low E-beam dose is sufficient to form the exposure pattern in the second imaging layer, a high throughput can be realized.

BRIEF DESCRIPTION OF THE DRAWING

The above and other teachings of the present invention will become more apparent upon a detailed description of the best mode for carrying out the invention as rendered below. In the description to follow, reference will be made to the accompanying Drawing, in which.

BEST MODE FOR CARRYING OUT THE INVENTON

Figure 1:
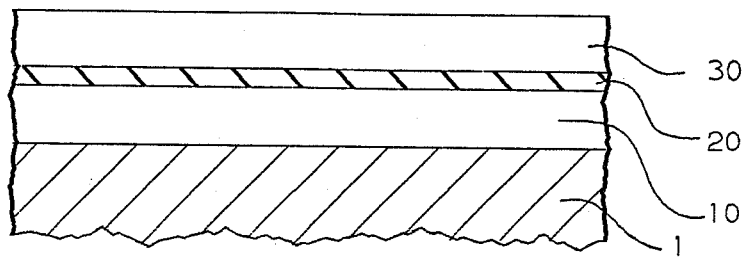
FIG. 1 is a cross-sectional view of a substrate having the two imaging layers formed thereon.

With reference to FIG. 1, two imaging layers 10 and 30 are disposed on a substrate 1. The substrate 1 is depicted as a unitary structure for the purpose of more clearly illustrating the invention. In practice substrate 1 could be comprises of a silicon or gallium arsenide wafer that may have one or more layers disposed on it to be patterned by use of the lithographic process of the invention. Imaging layer 30 can be made of and positive-acting material that can be patterned by an electron beam, e.g. polymethyl methacylate, or "PMMA." Imaging layer 10 can be made of any material in which silicon ions have a diffusion coefficient that is within the range of the diffusion coefficient in imaging layer 30. A conventional photosensitive polymer or other organic resin such as one of the "AZ" series of photosensitive novolac resins sold by the AZ Photoresist Products Group of American Hoechst Corp. of Somerville, N.J. ("AZ" is a trademark of American Hoechst Corp.) would meet the above criterion. Both imaging layers 10 and 30 can be formed on substrate 1 by spin-application to the desired thickness (typically 0.5 microns ±0.2 microns). Note that the imaging layer 30 should not be appreciably thicker than imaging layer 10. The layers can be of substantially equal thickness as shown in FIG. 1, or the imaging layer 30 can be thinner than imaging layer 10.

A layer of silicon oxide 20 is disposed between photoresist layers 10 and 30. The purpose of this silicon oxide layer 20 is to insure that photoresist layer 30 can be stripped without removing photoresist layer 10. The thickness of this silicon oxide layer should be on the order of several hundred Angstroms. The etch-stop function of silicon oxide layer 20 will be described in more detail below.

Figure 2:
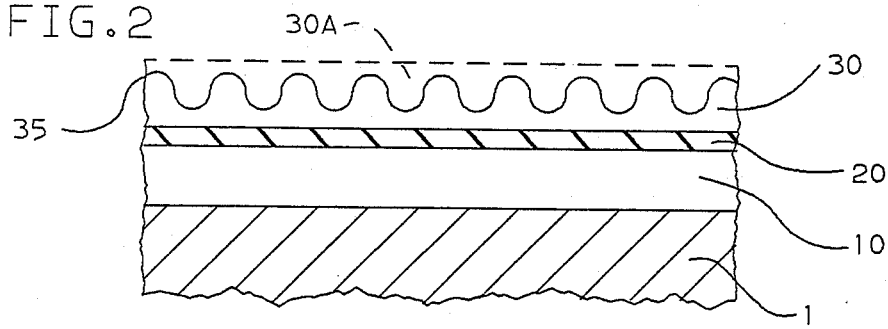
FIG. 2 is a cross-sectional view of a substrate having the two imaging layers, in which the upper layer is particularly patterned.

As shown in FIG. 2, the upper imaging layer 30 is then exposed to a direct-write E-beam that defines a standing wave pattern in an upper portion 30A of layer 30. The E-beam acceleration energy should be on the order of 20–30 kev. At this acceleration energy and low dose, the throughput of the exposure system is high. As shown in the Iida et al article, these acceleration energies will result in a standing wave exposure pattern being formed in the upper surface of the exposed imaging layer 30. Imaging layer 30 is then exposed to a wet developer (e.g. IPA) that selectively removes the exposed portions 30A without removing the bulk film. The resulting standing wave topology pattern 35 may define a sub-0.5 $\mu$m space peak-to-peak.

Figure 3:
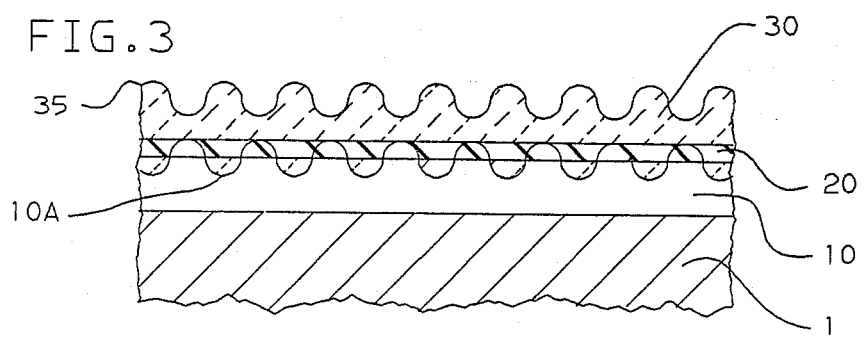
FIG. 3 is a cross-sectional view of a substrate having ions implanted into the upper and lower imaging layers.

Then, as shown in FIG. 3, ions are implanted through the upper imaging layer 30 to form implanted pits 10A in the lower imaging layer 10 as defined by the topology pattern 35. The implant energy/dose is a function of the thickness of imaging layer 30 as well as the diffusion coefficient of the particular ion specie through the particular imaging layer composition. The peak ion concentration should be at a point above the upper surface of imaging layer 10, such that the implanted pattern is centered about the interface between imaging layers 10 and 30. Note that the ions will penetrate through silicon oxide layer 20 without appreciably distorting the ion implant pattern. In this manner, only those portions of layer beneath the valleys defined by topology pattern 35 will be implanted with ions. The particular ion specie selected should provide a sufficiently high etch rate ratio between implanted and non-implanted portions of imaging layer 10, e.g. silicon or oxygen. The shape of the implanted pits 10A as well as the spacing between pits can also be controlled as a function of the implant energy (typically on the order of 100 kev).

Then, the upper imaging layer 30 is removed in an etchant that does not appreciably remove the silicon oxide layer 20. Such an etchant could be a solvent such as n-methyl pyrrollidone (NMP) or a dry etch such as an oxygen-based reactive ion etch (RIE). The dry etchant is preferably because it is more compatible with the subsequent processing described below.

Figure 4:
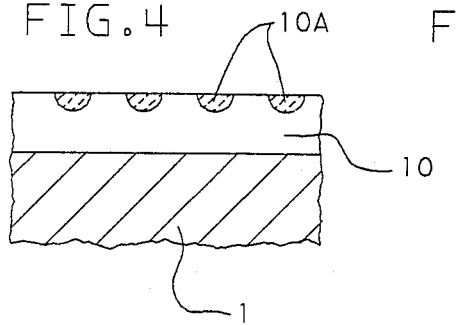
FIG. 4 is a cross-sectional view of a substrate having the upper imaging layer removed.

Then, the silicon oxide layer 20 is removed without appreciably removing the upper surface of the imaging layer 10. This is done by exposing the silicon oxide layer to a plasma etch in a $CF_4$—$O_2$ gas combination, wherein the oxygen content is low (e.g., less than 25% of the total gas mixture by volume). At this low oxygen concentration, both the implanted pits 10A and the non-implanted portions of photoresist 10 will etch more slowly than the silicon oxide layer 20. While it is possible that the implanted pits 10A may be etched at a somewhat faster rate than the bulk photoresist 10, the overall etch rate difference between these materials and the silicon oxide layer 10 should dominate. The resulting structure is shown in FIG. 4.

Figure 5:
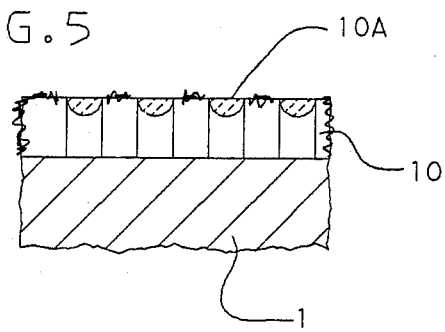
FIG. 5 is a cross-sectional view of a substrate having the lower imaging layer patterned so as to define small images.

Then, as shown in FIG. 5, the lower imaging layer 10 is treated in an anisotropic etchant that is highly selective between the bulk film 10 and the implanted pits 10A. For example, if the implanted specie was silicon, an oxygen-based RIE will anisotropically etch the exposed portions of imaging layer 10 without appreciably etching the pits 10A.

The resulting pattern can then be used to etch or define an ion implant with respect to the substrate 1 having none, one, or more layers thereon to be processed. Note that the pattern is formed by a process that utilizes a low E-beam dose, improving throughput. At the same time, due to its use of highly controllable implantation techniques, the process of the invention retains the narrow dimensions and other advantages present by direct write E-beam systems.

Various modifications can be made to the invention as described above. For example, the silicon oxide layer 20 could be deleted. With the oxide layer removed, the upper photoresist layer 30 would be stripped in an $O_2$ plasma. The etch would have to be monitored so that it is terminated before an excessive amount of the underlaying photoresist layer 10 is removed. Silicon oxide layer 20 could be constituted from another material, such as silicon nitride or silicon oxynitride, or it could be constituted by layers of different materials, such as a lower layer of silicon nitride and an upper layer of silicon oxide.

It is to be understood that the above teachings are not limitative to the invention per se. That is, various other modifications can be made to the best mode for carrying out the invention as described above without departing from the spirit and scope of the invention.

FIG. 1
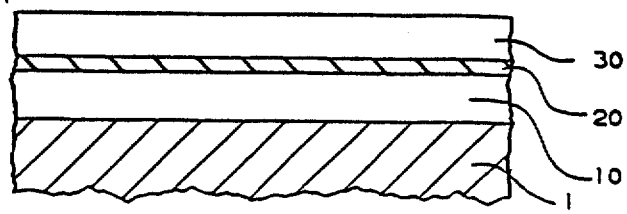

FIG. 2
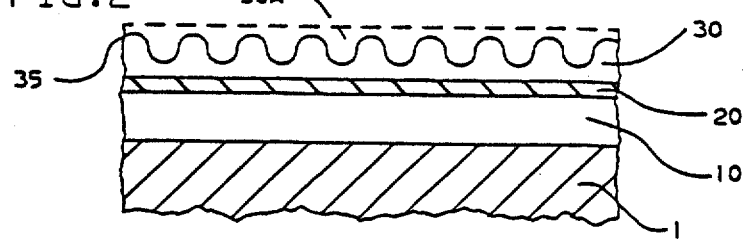

FIG. 3
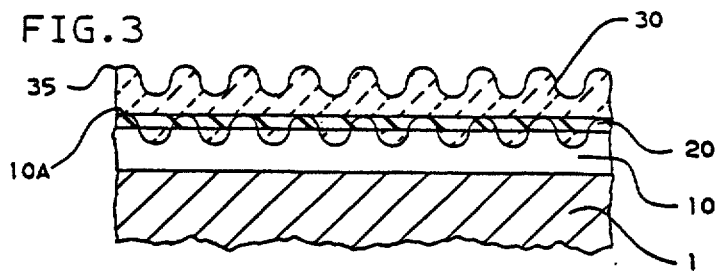

FIG. 4
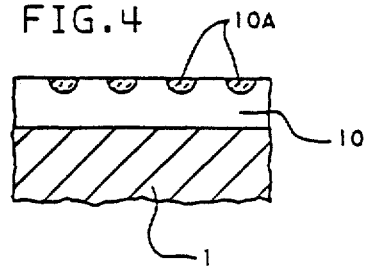

FIG. 5
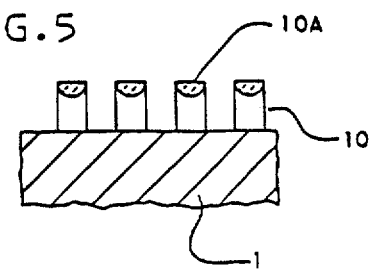

What is claimed is:

1. A method of forming sub-micron images in a first imaging layer disposed on a substrate having one or more layers thereon, comprising the steps of:

depositing a second imaging layer over said first imaging layer;

exposing said second imaging layer to an E-beam under conditions such that a standing wave exposure pattern is formed only in an upper portion of said second imaging layer;

developing said second imaging layer to convert said exposure pattern into a standing wave topology pattern in said upper portion of said second imaging layer;

implanting ions through said second imaging layer into portions of said first imaging layer as defined by said standing wave topology pattern, to form implanted pits in said first imaging layer;

removing said second imaging layer without appreciably removing said first imaging layer; and anisotropically etching said first imaging layer in a etchant that does not appreciably attack said implanted pits of said first imaging layer.

2. The method as recited in claim 1, wherein said first imaging layer is comprised of a photosensitive novolac resin material, and wherein said second imaging layer is comprised of a resinous material that can be patterned by an electron beam.

3. The method as recited in claim 1, wherein said standing wave topology pattern has an upper half and a lower half.

4. The method as recited in claim 3, wherein portions of said first imaging layer beneath said lower half of said standing wave tolopogy pattern in said second imaging layer receive said ions implanted through said second imaging layer to form said implanted pits.

5. The method as recited in claim 4, wherein said ions comprise silicon ions.

6. The method as recited in claim 4, wherein said ions comprise oxygen ions.

7. The method as recited in claim 4, wherein said first imaging layer is anisotropically etched by exposure to an $O_2$ RIE.

8. A method of forming sub-micron images in a first imaging layer arranged on a substrate having one or more layers thereon, comprising the steps of:

depositing a thin etch-stop layer on said first imaging layer;

depositing a second imaging layer on said etch-stop layer;

exposing said second imaging layer to an E-beam, so as to form a standing wave exposure pattern in an upper portion of said of said second imaging layer;

developing said second imaging layer to convert said standing wave exposure pattern into a standing wave topology pattern having peaks and valleys therein;

implanting silicon ions through said second imaging layer and said etch-stop layer into portions of said first imaging layer beneath said valleys of said standing wave topology pattern in said second imaging layer;

removing said second imaging layer in an etchant that does not appreciably attack said etch-stop layer;

removing said etch-stop layer in an etchant that does not appreciably attack said first imaging layer; and anisotropically etching portions of said first imaging layer between said implanted portions of said first imaging layer.

9. The method as recited in claim 8, wherein said first imaging layer is comprised of a novolak-based photosensitive resin, and wherein said second imaging layer is comprised of PMMA.

10. The method as recited in claim 8, wherein said etch-stop layer is comprised of silicon oxide.

11. The method as recited in claim 8, wherein said second imaging layer is removed by exposure to an $O_2$ plasma.

12. The method as recited in claim 11, wherein said etch-stop layer is removed by exposure to a $CF_4+O_2$ plasma.

13. The method as recited in claim 12, wherein said first imaging layer is anisotropically etched by exposure to an $O_2$ RIE.

* * * * *

UNITED STATES PATENT AND TRADEMARK OFFICE
CERTIFICATE OF CORRECTION

PATENT NO. : 4,772,539

DATED : September 20, 1988

INVENTOR(S) : Sherry J. Gillespie

It is certified that error appears in the above-identified patent and that said Letters Patent is hereby corrected as shown below:

Delete the printed drawing, and insert the attached Drawing (Figs. 1-5) as shown on the attached sheet.

Signed and Sealed this

Twenty-eighth Day of February, 1989

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,772,539

DATED : September 20, 1988

INVENTOR(S) : Sherry J. Gillespie

It is certified that error appears in the above-identified patent and that said Letters Patent is hereby corrected as shown below: